(12) United States Patent
Suzuki et al.

(10) Patent No.: US 11,923,178 B2
(45) Date of Patent: Mar. 5, 2024

(54) VACUUM PROCESSING APPARATUS

(71) Applicant: ULVAC, INC., Kanagawa (JP)

(72) Inventors: Koji Suzuki, Kanagawa (JP); Hideto Nagashima, Kanagawa (JP); Yoshinori Fujii, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 471 days.

(21) Appl. No.: 17/272,861

(22) PCT Filed: Sep. 12, 2019

(86) PCT No.: PCT/JP2019/035869
§ 371 (c)(1),
(2) Date: Mar. 2, 2021

(87) PCT Pub. No.: WO2020/100400
PCT Pub. Date: May 22, 2020

(65) Prior Publication Data
US 2021/0319985 A1 Oct. 14, 2021

(30) Foreign Application Priority Data

Nov. 16, 2018 (JP) .................................. 2018-215816

(51) Int. Cl.
*H01J 37/32* (2006.01)
*C23C 14/34* (2006.01)

(52) U.S. Cl.
CPC .... *H01J 37/32522* (2013.01); *C23C 14/3407* (2013.01); *H01J 37/32504* (2013.01)

(58) Field of Classification Search
CPC ........... H01J 37/32522; H01J 37/32504; H01J 37/3441; H01J 37/3447; C23C 14/3407;
(Continued)

(56) References Cited

U.S. PATENT DOCUMENTS 9,021,984 B2* 5/2015 Yamamoto ............ C23C 16/509
156/345.43
2003/0066607 A1* 4/2003 White ................. C23C 16/5096
156/345.43
(Continued)

FOREIGN PATENT DOCUMENTS

JP 2000-073162 A 3/2000
JP 2005-336572 A 12/2005
(Continued)

OTHER PUBLICATIONS

JP-2017122262-A Translation (Year: 2017).*
International Search Report for PCT Patent App. No. PCT/JP2019/035869 (dated Oct. 29, 2019).

*Primary Examiner* — Nicholas A Smith
*Assistant Examiner* — Patrick S Ott
(74) *Attorney, Agent, or Firm* — Cermak Nakajima & McGowan LLP; Tomoko Nakajima

(57) ABSTRACT

A vacuum processing apparatus SM of this invention has: a vacuum chamber which performs a predetermined processing on a to-be-processed substrate that is set in position in the vacuum chamber. Inside the vacuum chamber there is disposed a deposition preventive plate) which is made up of a fixed deposition preventive plate and a moveable deposition preventive plate which is moveable in one direction. Further provided are: a metal block body disposed in a vertical posture on an inner wall surface of the vacuum chamber; and a cooling means for cooling the block body. In a processing position in which a predetermined vacuum processing is performed on the to-be-processed substrate, a top surface of the block body is arranged to be in proximity to or in contact with the moveable deposition preventive plate.

3 Claims, 4 Drawing Sheets

(58) Field of Classification Search
CPC ....... C23C 14/35; C23C 14/50; C23C 14/564; C23C 14/34; Y02E 10/50; H01L 21/285; H01L 21/3065
See application file for complete search history.

(56) References Cited

U.S. PATENT DOCUMENTS

| | | | |
|---|---|---|---|
| 2011/0303527 A1* | 12/2011 | Hosoya | C23C 14/352 204/192.15 |
| 2014/0356985 A1* | 12/2014 | Ricci | C23C 16/4586 118/712 |
| 2015/0294845 A1 | 10/2015 | Shimane et al. | |
| 2017/0004995 A1* | 1/2017 | Asakawa | C23C 14/165 |
| 2018/0016675 A1* | 1/2018 | Krassnitzer | H01J 37/32477 |

FOREIGN PATENT DOCUMENTS

| | | | |
|---|---|---|---|
| JP | 2011-127136 A | | 6/2011 |
| JP | 2014-091861 A | | 5/2014 |
| JP | 2017122262 A | * | 7/2017 |
| JP | 2019-019377 A | | 2/2019 |
| WO | WO2014/103168 A1 | | 7/2014 |

* cited by examiner

VACUUM PROCESSING APPARATUS

This application is a national phase entry under 35 U.S.C. § 371 of PCT Patent Application No. PCT/JP2019/035869, filed on Sep. 12, 2019, which claims priority under 35 U.S.C. § 119 to Japanese Patent Application No. 2018-215816, filed Nov. 16, 2018, both of which are incorporated by reference.

TECHNICAL FIELD

The present invention relates to a vacuum processing apparatus which has a vacuum chamber and which is adapted to perform a predetermined vacuum processing on a substrate to be processed (hereinafter called a "to-be-processed substrate"), the substrate being set in position inside the vacuum chamber.

BACKGROUND ART

In a manufacturing step, e.g., of semiconductor devices, there is a step in which a predetermined vacuum processing is performed on a to-be-processed substrate such as a silicon wafer, the processing being performed inside a vacuum chamber which is capable of forming a vacuum atmosphere. In this kind of vacuum processing there are utilized a film forming apparatus according to a vacuum evaporation method, an ion plating method, a sputtering method or a plasma CVD method, a dry etching apparatus, a vacuum heat treatment apparatus, and the like. For example, the vacuum processing apparatus (sputtering apparatus) for performing film forming by sputtering method is known in, e.g., patent document 1. This vacuum processing apparatus has a vacuum chamber which is capable of forming a vacuum atmosphere and, on an upper part thereof, has disposed a target for sputtering. On a lower part of the vacuum chamber there is provided a stage for disposing thereon a to-be-processed substrate in a manner to lie opposite to the target.

In film formation of a predetermined thin film by using the above-mentioned sputtering apparatus, in a state in which a single to-be-processed substrate is disposed on the stage, a rare gas (and a reactive gas) are introduced into the vacuum chamber which is in a vacuum atmosphere, and the target is charged, e.g., with DC power having a negative potential or AC power of a predetermined frequency. According to these operations, a plasma atmosphere is formed in the vacuum chamber, and such ions of the rare gas as are ionized in the plasma are collided with the target so that the target gets sputtered. The sputtered particles splashed from the target get adhered to, and deposited on, the surface of the to-be-processed substrate, so that a predetermined thin film is formed depending on the kind of the target. When the target gets sputtered, the sputtered particles splash from the surface of the target according to the predetermined cosine law, but the sputtered particles partly splash toward other than the to-be-processed substrate. The vacuum chamber is ordinarily provided with a deposition preventive plate made of metal, at a distance to the inner wall surface of the vacuum chamber, in order to prevent the sputtered particles from getting adhered to the inside wall surfaces of the vacuum chamber.

Here, in case a plurality of to-be-processed substrates are sequentially subjected to film formation (so-called sheet-feeding type of vacuum processing apparatus), a to-be-processed substrate before processing is transported to the stage, or the to-be-processed substrate that has been processed must be transported out of the stage. In the above-mentioned known sputtering apparatus, the deposition preventive plate is made up of a fixed deposition preventive plate which is disposed by fixing to the vacuum chamber and a moveable deposition preventive plate that is moveable in one direction. Then, at the time of film formation, by partly overlapping the fixed deposition preventive plate and the moveable deposition preventive plate with each other, the adhesion of the sputtered particles to the inside wall surface of the vacuum chamber can be prevented. On the other hand, at the time of transporting the substrate, the moveable deposition preventive plate is moved relative to the fixed deposition preventive plate so as to form a space between the fixed deposition preventive plate and the moveable deposition preventive plate. Through this space the passage of a vacuum transfer robot is allowable, whereby the to-be-processed substrate can be transported in and out of the stage. In case a non-used deposition preventive plate is set in position inside the vacuum chamber, it is normal practice to perform, prior to the film formation on the to-be-processed substrate, a so-called baking processing in which the deposition preventive plate is heated to a predetermined temperature to thereby degas the deposition preventive plate and the like.

By the way, at the time of film forming by sputtering, the deposition preventive plate is heated by the heat of radiation and the like of plasma and, as the number of to-be-processed substrates on which films are formed increases, gradually reaches an elevated temperature. Then, once the deposition preventive plate rises in temperature beyond the temperature at the time of baking processing, there will be discharged various gases (oxygen, water vapor and the like) that remain on the rear surface of the adhesion preventive plate, without being vacuum-exhausted from the rear surface of the deposition preventive plate which is free from adhesion and deposition of the sputtered particles. Should these discharging gases be captured into the thin film during film formation, deterioration, e.g., of film quality will occur. Therefore, it is necessary to suppress such occurrence to the extent possible. This kind of discharge gas is considered to impart an unfavorable influence such as varying the etching shape at the time of performing dry etching the to-be-processed substrate by, e.g., the dry etching apparatus.

Conventionally, it is generally known to additionally provide a cooling pipe in a snaking manner on the rear-surface side of the deposition preventive plate, or to form a circulation passage of a coolant inside the deposition preventive plate having a predetermined thickness, thereby performing cooling of the deposition preventive plate by circulating the coolant through the cooling passage or the circulation passage (see, e.g., patent document 2). However, this kind of deposition preventive plate is complicated in its own construction and is expensive in cost. Further, in case this kind of arrangement is applied to the moveable deposition preventive plate, the piping from a chiller unit which is disposed outside the vacuum chamber must be connected to the cooling pipe or the circulation passage through couplings and the like. At the same time, since it is necessary to arrange the piping system itself to be moveable accompanied by the movement of the moveable deposition preventive plate, there is an increased risk in that the water leakage inside the vacuum chamber may occur, the water leakage giving rise to the damage to the vacuum processing apparatus.

PRIOR ART DOCUMENTS

Patent Documents

Patent Document 1: JP-2014-91861-A
Patent Document 2: JP-2000-73162-A

SUMMARY OF THE INVENTION

Problems that the Invention is to Solve

This invention has been made in view of the above-mentioned points and has a problem of providing a vacuum processing apparatus in which the moveable deposition preventive plate disposed in the vacuum chamber can be cooled in a simple arrangement.

Means for Solving the Problems

In order to solve the above-mentioned problem, this invention is a vacuum processing apparatus which comprises a vacuum chamber and which performs a predetermined vacuum processing on a to-be-processed substrate set in position in the vacuum chamber, the vacuum chamber having therein a deposition preventive plate which is made up of a fixed deposition preventive plate and a moveable deposition preventive plate. The vacuum processing apparatus further comprises: a block body which us made of metal and which is disposed in a vertical posture on an inner wall surface of the vacuum chamber; and a cooling means for cooling the block body. At a processing position of performing a predetermined vacuum processing on the to-be-processed substrate, a top surface of the block body is arranged to be in proximity to or in contact with the moveable deposition preventive plate.

According to this invention, by a simple arrangement of only disposing in a vertical posture the block body on the inner wall surface of the vacuum chamber, the moveable deposition preventive plate that is in the processing position can be cooled by radiation cooling from the block body or by heat transfer through the surface of contact with the deposition preventive plate. As a consequence, the moveable deposition preventive plate can be prevented from getting heated beyond a predetermined temperature. In this case, since the block body is immovably disposed on the inner wall surface of the vacuum chamber, there can be minimized to the extent possible the risk of causing such water leakage inside the vacuum chamber as may lead to the damage to the vacuum processing apparatus.

By the way, there are many examples in which the wall surface of the vacuum chamber is provided with a jacket for circulating a heating medium, for use in baking to be performed prior to the predetermined vacuum processing inside the vacuum chamber. Therefore, in this invention, an arrangement shall preferably be employed in that the cooling means is made up of a jacket disposed on a wall surface of the vacuum chamber such that the block body is cooled by heat transfer from the wall surface of the vacuum chamber when a coolant is circulated through the jacket. According to this arrangement, only by circulating the coolant through this jacket, the block body can be cooled by heat transfer from the wall surface of the vacuum chamber. Therefore, parts such as piping and the like for cooling the block body can be omitted and, as a result, the risk of water leakage inside the vacuum chamber can be eliminated. In this case, the vacuum processing apparatus may further comprise a heat transfer sheet interposed between the inner wall surface of the vacuum chamber and the block body.

MODES FOR CARRYING OUT THE INVENTION

With reference to the drawings, a description will hereinafter be made of an embodiment of a vacuum processing apparatus of this invention by citing an example in which, provided that the vacuum processing apparatus is a magnetron type of sputtering apparatus, and that the to-be-processed substrate is a silicon wafer (hereinafter referred to as a "substrate Sw"), a predetermined thin film is formed on a surface of the substrate Sw. In the following description, the terms denoting the direction (orientation) shall be based on the posture of installation of the sputtering apparatus SM as the vacuum processing apparatus as shown in FIG. 1.

Figure 1:
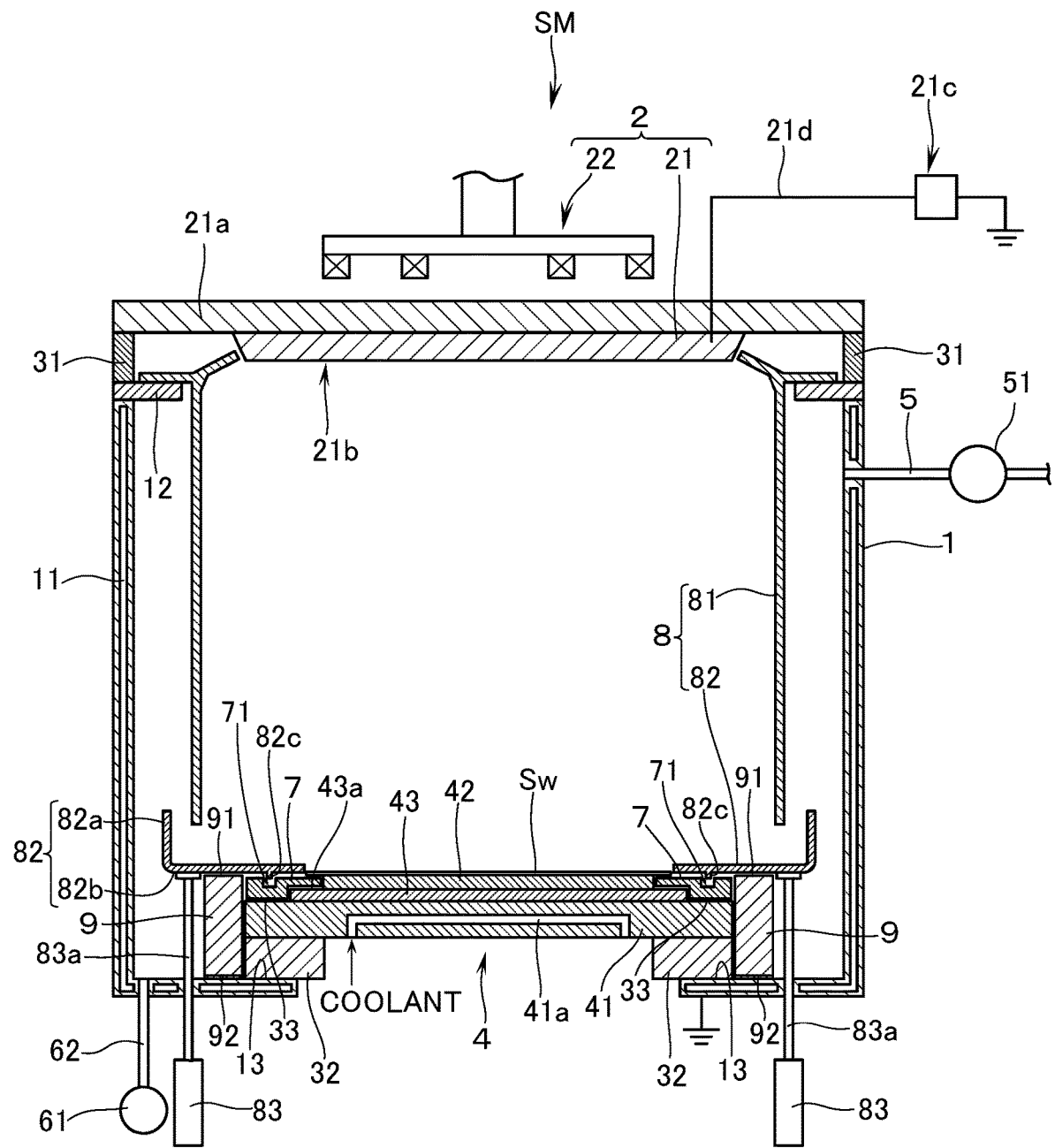
FIG. 1 is a schematic sectional view showing a sputtering apparatus according to an embodiment of this invention.

With reference to FIG. 1, the mark SM denotes a sputtering apparatus according to this embodiment. The sputtering apparatus SM is provided with a vacuum chamber 1. The side wall and the lower wall of the vacuum chamber 1 are provided with a jacket 11 which is connected to a circulation unit (not illustrated) for heating medium or coolant. It is thus so arranged that the side wall and the lower wall of the vacuum chamber 1 can be appropriately heated or cooled by circulating the heating medium or coolant. In an upper opening of the vacuum chamber 1, a cathode unit 2 is detachably mounted.

The cathode unit 2 is made up of a target 21, and a magnet unit 22 which is disposed above the target 21. As the target 21 there will be utilized known one of aluminum, copper, titanium, aluminum oxide, and the like. As to the target 21, in a state in which it is mounted on a backing plate 21a and in a posture in which the sputtering surface 21b (i.e., the surface to get sputtered) looks downward, the target is mounted on an upper part of the vacuum chamber 1 through an insulating body 31 which is disposed on the upper wall of the vacuum chamber 1 and which also serves the purpose of a vacuum seal. The target 21 has connected thereto an output 21d from a sputtering power supply 21c which is made up of a DC power supply or an AC power supply and the like depending on the kind of the target. It is thus so arranged that, depending on the kind of the target, a predetermined power supply having, e.g., a negative electric potential or a high-frequency power supply of a predetermined frequency can be supplied to the target 21. The magnet unit 22 has a known closed magnetic field or cusped magnetic field structure which generates a magnetic field in a space below the sputtering surface 21b of the target 21, collects the ions and the like ionized below the sputtering surface 21b at the time of sputtering so as to efficiently ionize the sputtered particles splashed from the target 21. Such being the case, detailed explanation thereof will be omitted here.

At the lower part of the vacuum chamber 1, there is disposed a stage 4 in a manner to lie opposite to the target 21. The stage 4 is made up of: a metal base 41 which is disposed through an insulating body 32 provided at the bottom of the vacuum chamber 1 and which has a cylindrical contour; and a chuck plate 42 which is bonded to the upper surface of the base 41. The chuck plate 42, which is made, e.g., of aluminum nitride and has an outer diameter which is slightly smaller than the upper surface of the base 41. Although not described in particular with illustration, the chuck plate has buried therein electrodes for an electrostatic chuck. It is thus so arranged that, when voltage is applied to the electrodes from an electric power supply (not illustrated), the substrate Sw is electrostatically sucked to the upper surface of the chuck plate 42. Further, the base 41 has formed therein a coolant circulation passage 41a which circulates the coolant from a chiller unit (not illustrated). Between the base 41 and the chuck plate 42, there is interposed a hot plate 43 made, e.g., of aluminum nitride so as to be heated through energization to a predetermined temperature (e.g., 300° C. to 500° C.). In this case, it is also possible to embed a heater inside the chuck plate 42 so as to form the chuck plate 42 and the hot plate 43 integrally. It is thus so arranged that the substrate Sw is controlled within a predetermined temperature range above the room temperature by the heating with the hot plate 43 and by the cooling of the base 41 with the circulation of the coolant through the coolant circulation passage 41a.

A side wall of the vacuum chamber 1 has connected thereto a gas pipe 5 for introducing a sputtering gas, and the gas pipe 5 is communicated with a gas source (not illustrated) through a mass flow controller 51. The sputtering gas includes not only an inert gas such as argon gas and the like that is introduced into the vacuum chamber 1 at the time of forming a plasma therein, but also a reactive gas such as oxygen gas, nitrogen gas, and the like. Further, the lower wall of the vacuum chamber 1 has connected thereto an exhaust pipe 62 which is in communication with a vacuum pump 61 which is made up of a turbo molecular pump, a rotary pump, and the like. It is thus so arranged that the vacuum chamber 1 is evacuated at a constant speed so as to maintain the vacuum chamber 1 at a predetermined pressure in a state in which the sputtering gas has been introduced therein at the time of sputtering.

Around the stage 4 inside the vacuum chamber 1, in a manner to cover the base 41 which is exposed radially outward and, further, an upper surface portion 43a of the hot plate 43, there is disposed, at a clearance from the above, a platen ring 7 which serves the purpose of a deposition preventive plate. The platen ring 7 is made of a known material such as aluminum oxide, stainless steel and the like, and is disposed on the upper surface of the base 41 through an insulating body 33. The upper surface of the platen ring 7 is arranged to be substantially flush with the upper surface of the chuck plate 42. The upper surface of the platen ring 7 is arranged to be substantially flush with the upper surface of the chuck plate 42. Further, the vacuum chamber 1 is provided inside thereof with metallic deposition preventive plates 8 for preventing the sputtered particles, as the substance that is generated by sputtering of the target 21, from getting adhered to the inner wall surface of the vacuum chamber 1.

The deposition preventive plate 8 is made up of an upper deposition preventive plate 81 and a lower deposition preventive plate 82, each being made of a known material such as aluminum oxide, stainless steel and the like. In this embodiment, the upper deposition preventive plate 81 constitutes a fixed deposition preventive plate, and the lower deposition preventive plate 82 constitutes a moveable deposition preventive plate, respectively. The upper deposition preventive plate 81 has a cylindrical contour and is suspended by means of an engaging part 12 disposed on an upper part of the vacuum chamber 1. The lower deposition preventive plate 82 also has a cylindrical contour and, on a free end on the radially outside, has formed an erected wall part 82a which is erected upward. The lower deposition preventive plate 82 has connected thereto a drive shaft 83a from a driving means 83 such as a motor, an air cylinder, and the like, the drive shaft 83a extending through a lower wall of the vacuum chamber 1. By the driving means 83 the lower deposition preventive plate 82 is moveable up and down which is one direction of the vacuum chamber 1.

In a position (processing position) at which the lower deposition preventive plate 82 has been moved down (lowered) by the driving means 83 to the lowest side, the lower end part of the upper deposition preventive plate 81 and the upper end part of the erected wall part 82a are arranged to be overlapped with each other in the vertical direction. The lower end part of the upper deposition preventive plate 81 and the upper end part of the erected wall part 82a form a so-called labyrinth seal. It is thus so arranged that, at the time of film forming by sputtering, the sputtered particles can be prevented from adhering to the inner wall surface of the vacuum chamber 1. On the other hand, in a position (transporting position) at which the lower deposition preventive plate 82 has been moved (upward) from the processing position to a predetermined position (height) by the driving means 83, a predetermined space will be formed below the lower deposition preventive plate 82. Although not described by illustration, in this case, the side wall of the vacuum chamber 1 has formed therein a delivery opening which opens to the above-mentioned space and which is provided with a gate valve. It is thus so arranged that the substrate Sw can be handed over to, or received from, the stage 4 through this delivery opening by means of a vacuum transfer robot (not illustrated)

Such a flat part 82b of the lower deposition preventive plate 82 as extends at right angles to the vertical direction is sized such that the diametrically inside part (right-and-left direction in FIG. 1) lies opposite to the platen ring 7. The flat part 82b has formed one annular projection 82c in a predetermined position on the lower surface. An upper surface of the platen ring 7 has formed therein an annular recessed groove 71 in a manner to correspond to the projection 82c. Then, in a state in which the lower deposition preventive plate 82 has been moved to the processing position (in this case, the flat part 82b of the lower deposition preventive plate 82 will be moved toward the inner wall surface of the vacuum chamber, in concrete, will be moved in the direction of moving toward or away relative to the inner surface of the lower wall), a so-called labyrinth seal is formed by the projection 82c of the flat part 82b and the recessed groove 71 of the platen ring 7. It is thus so arranged that the sputtered particles can be prevented from wrapping (turning) around into the space inside the vacuum chamber 1 that is positioned below the lower deposition preventive plate 82 in the circumference of the substrate Sw. A description will hereinbelow be made of an example of a method of forming an aluminum film on the surface of the substrate Sw by the above-mentioned sputtering apparatus SM, with the target being defined as aluminum.

After having set in position, inside the vacuum chamber 1, various kinds of constituting parts such as the target 21, the platen ring 7, the deposition preventive plate 8, and the like, the vacuum pump 61 is operated to evacuate the hermetically sealed vacuum chamber 1. In concert with the above operations, a heating medium of a predetermined temperature is circulated in the jacket 11. In this manner there is performed a so-called baking processing in which the wall surface of the vacuum chamber 1 in the vacuum atmosphere and parts such as deposition preventive plate inclusive of the platen ring 7 are heated to a predetermined temperature. Then, at the transfer position of the lower deposition preventive plate 82, a substrate Sw is transferred by a vacuum transfer robot (not illustrated) onto the stage 4, and the substrate Sw is mounted on the upper surface of the chuck plate 42. Once the vacuum transfer robot has retreated, the lower deposition preventive plate 82 is moved to the processing position so as to prevent the sputtered particles from getting adhered to the inner wall of the vacuum chamber 1. Then, a predetermined voltage is applied from the chuck power supply to the electrodes for the electrostatic chuck. The substrate Sw is thus electrostatically sucked to the chuck plate 42. Together with this, the substrate Sw is controlled to a predetermined temperature above the room temperature (e.g., 350° C.) as a result of heating by the hot plate 43 and as a result of cooling of the base 41 by the circulation of coolant to the coolant circulation passage 41a.

When the inside of the vacuum chamber 1 has been evacuated to a predetermined pressure (e.g., $10^{-5}$ Pa) and also, when the substrate Sw has attained a predetermined temperature, argon gas as a sputtering gas is introduced in a certain flow rate (e.g., argon partial pressure of 0.1 Pa) through the gas pipe 5. Together with the above, a predetermined power (e.g., 3 to 50 kW) with negative electric potential is supplied from the sputtering power supply 21c to the target 21. According to these operations, plasma is formed inside the vacuum chamber 1, the sputtering surface 21b of the target gets sputtered by the ions of the argon gas in the plasma, and the sputtered particles from the target 21 get adhered to, and deposited on, the substrate Sw, thereby forming an aluminum film. When the film forming has been finished, the introduction of the gas and the application of electric power to the target are once stopped. The lower deposition preventive plate 82 is moved to the transfer position, and the processed substrate Sw is taken out of the stage 4 by the vacuum transfer robot (not illustrated). By repeating the above-mentioned operations, film forming (vacuum processing) is performed on a plurality of substrates Sw.

At the time of film formation by sputtering, the upper deposition preventive plate 81 and the lower deposition preventive plate 82 are heated by the heat of radiation and the like of plasma and, with an increase in the number of substrates Sw on which films are formed, they will gradually reach an elevated temperature. In the arrangement according to this embodiment, since the flat part 82b of the lower deposition preventive plate 82 lies opposite to the platen ring 7 that is heated by the radiation from the hot plate 43, the lower deposition preventive plate 82 is particularly likely to be heated. Then, if the upper deposition preventive plate 81 and the lower deposition preventive plate 82 rise in temperature (particularly, the lower deposition preventive plate 82 that is positioned adjacent to the substrate Sw), various gases (oxygen, water vapor and the like) will come to be ejected without vacuum exhausting from the rear surfaces of the upper deposition preventive plate 81 and the lower deposition preventive plate 82 to which the sputtered particles do not adhere to, and deposit on. If these ejected gases are taken into the thin film during film forming, deterioration of the film quality, for example, will happen. Therefore, such an occurrence must be suppressed to the best extent possible.

Figure 2:
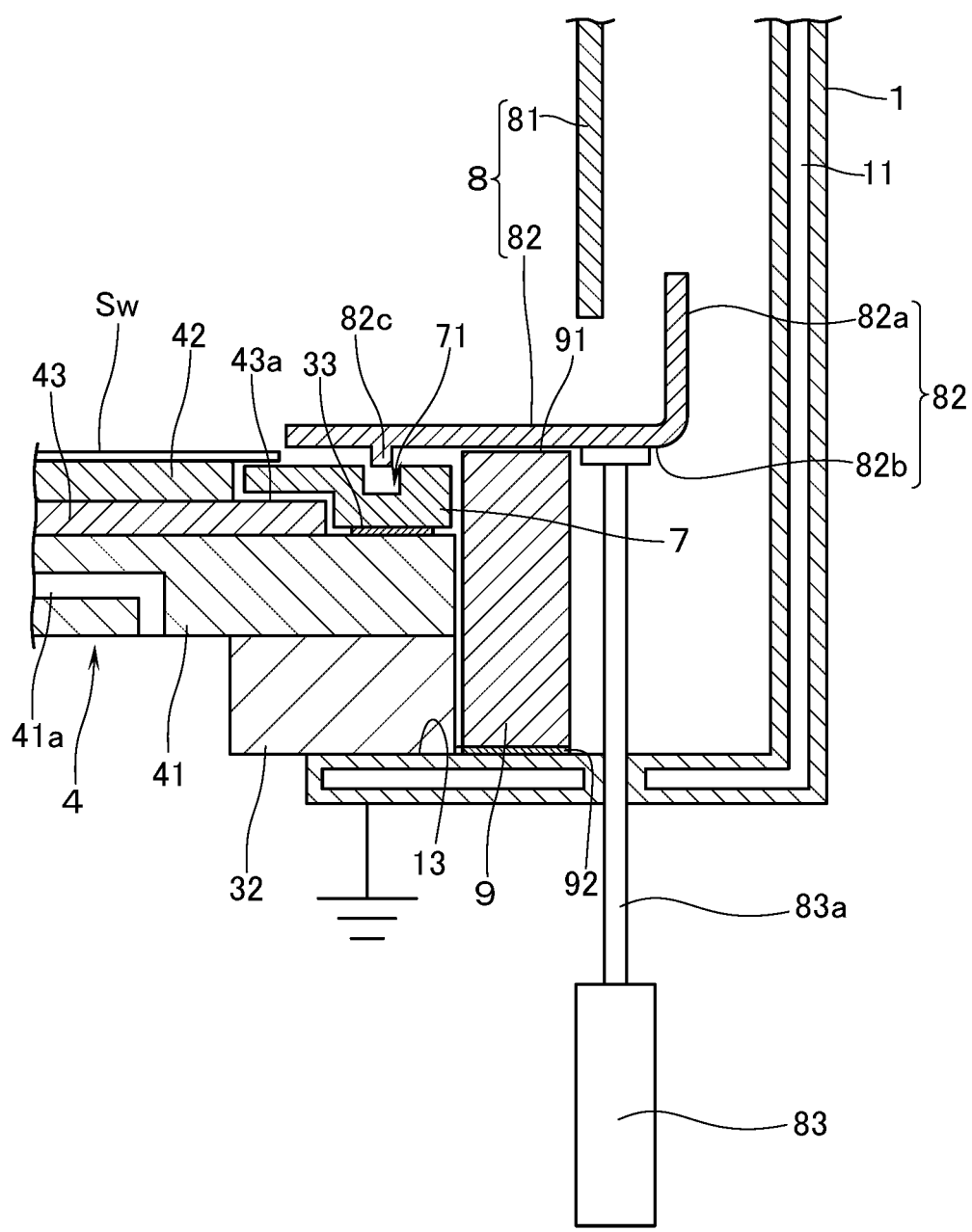
FIG. 2 is a sectional view showing in enlargement a part of FIG. 1.

In this embodiment, as shown in FIG. 2, a block body 9 formed into the shape of a cylinder is disposed in a vertical posture on the lower-wall inside surface 13 of the vacuum chamber 1 in a manner to lie opposite to the flat part 82b of the lower deposition preventive plate 82. The block body 9 is made of metal of good heat transfer characteristics such as aluminum, copper and the like. The height to the top surface 91 of the block body 9 is dimensioned such that, in a processing position of the lower deposition preventive plate 82, the top surface 91 of the block body 9 and the lower surface of the lower deposition preventive plate 82 (i.e., the flat part 82b) lie opposite to each other at a clearance therebetween. The clearance in the up and lower (vertical) direction is set to 1 mm or below, preferably to 0.5 mm or below. Further, between the lower-wall inside surface 13 of the vacuum chamber 1 and the block body 9, there is interposed a heat transfer sheet 92, which improves the heat transfer, such as a silicon sheet and an indium sheet. It is thus so arranged that, during film forming, a coolant at a predetermined temperature is caused to flow through the jacket 11, the block body 9 can be cooled to a predetermined temperature by heat transfer through the heat transfer sheet 92 from the wall surface of the vacuum chamber 1. In this embodiment, the jacket 11 constitutes the cooling means for cooling the block body 9. The volume of the block body 9, the area of the upper surface 91 (the area of the surface to lie opposite to the deposition preventive plate), the relative position of the block body 9 relative to the deposition preventive plate 82, and the like are appropriately set considering the temperature and the like of the lower deposition preventive plate 82 to be cooled.

According to the above-mentioned embodiment, by a simple construction of disposing in a vertical posture the block body 9 on the lower-wall inside surface 13 of the vacuum chamber 1, the lower deposition preventive plate 82 that is in the processing position can be cooled by radiation cooling from the block body 9. As a result, the lower deposition preventive plate 82 can be prevented from being heated, during vacuum processing, above the predetermined temperature and, in turn, gas ejection accompanied by the increase in temperature of the lower deposition preventive plate 82 can be suppressed to the extent possible. The possible occurrence can be prevented in that the ejected gases are captured during film formation to thereby bring about, e.g., deterioration in the film quality. In this case, the block body 9 is fixedly disposed on the inner wall surface of the vacuum chamber 1, and the work of connecting the piping for supplying the coolant can be omitted. Therefore, the risk of occurrence of water leakage inside the vacuum chamber 1, which may lead to the damage to the sputtering apparatus SM, can be minimized to the extent possible. In addition, only by circulating the coolant through this jacket 11 by making use of the existing jacket 11 equipped in the vacuum chamber 1, the block body 9 can be cooled by heat transfer from the wall surface of the vacuum chamber 1.

Descriptions have been made hereinabove of the embodiment of this invention, but this invention shall not be limited to the above. As long as the substance of this invention is not deviated from, various modifications are possible. In this embodiment, description has been made of an example in which the portion of object for cooling is made up of the flat part 82b of the lower deposition preventive plate 82 that is, from the viewpoint of the structure of the sputtering apparatus SM, particularly likely to attain an elevated temperature and that serves as the moveable deposition preventive plate moveable toward and away relative to the lower-wall inside surface of the vacuum chamber 1. In order to thus cool the flat part 82b, the block body 9 is disposed in a vertical posture on the lower-wall inside surface 13 of the vacuum chamber 1. However, without being limited to the above, for example, in order to enable to cool the erected wall part 82a of the lower deposition preventive plate 82 that moves along the vertical direction, the block body 9 may also be disposed in a vertical posture on the side-wall inside surface of the vacuum chamber 1. In addition, the cooling structure using the block body 9 of this invention is also effective with reference to the fixed deposition preventive plate 81. By the way, in case the block body 9 is disposed in a vertical posture on the wall surface of the vacuum chamber 1, the heat transfer sheet 92 may be omitted.

Further, in the above-mentioned embodiment, a description was made of an example in which, at the processing position of the lower deposition preventive plate 82, the lower surface of the flat part 82b of the lower deposition preventive plate 82 is disposed to lie opposite to the top surface 91 of the block body 9 with a clearance therebetween. However, without being limited thereto, it may be so arranged that, at the processing position of the lower deposition preventive plate 82, the lower surface of the flat part 82b comes into contact with the top surface 91 of the block body 9 so that the lower deposition preventive plate 82 can be cooled by heat transfer through surface contact. However, depending on the vacuum processing to be performed inside the vacuum chamber 1, there are cases, e.g., where the sputtered particles get adhered by turning around to the lower surface of the flat part 82b. In such a case, if the lower surface of the flat part 82b and the top surface 91 of the block body 9 are brought into contact with each other, there is a possibility of giving rise to generation of the particles that may impede the good vacuum processing. Therefore, there is a case where a positioning mechanism shall preferably be provided so that a clearance below 1 mm can constantly be formed, when the lower deposition preventive plate 82 is at the processing position, between the lower deposition preventive plate 82 and the block body 9 even if the lower deposition preventive plate 82 is repeatedly moved up and down.

Figure 3A:
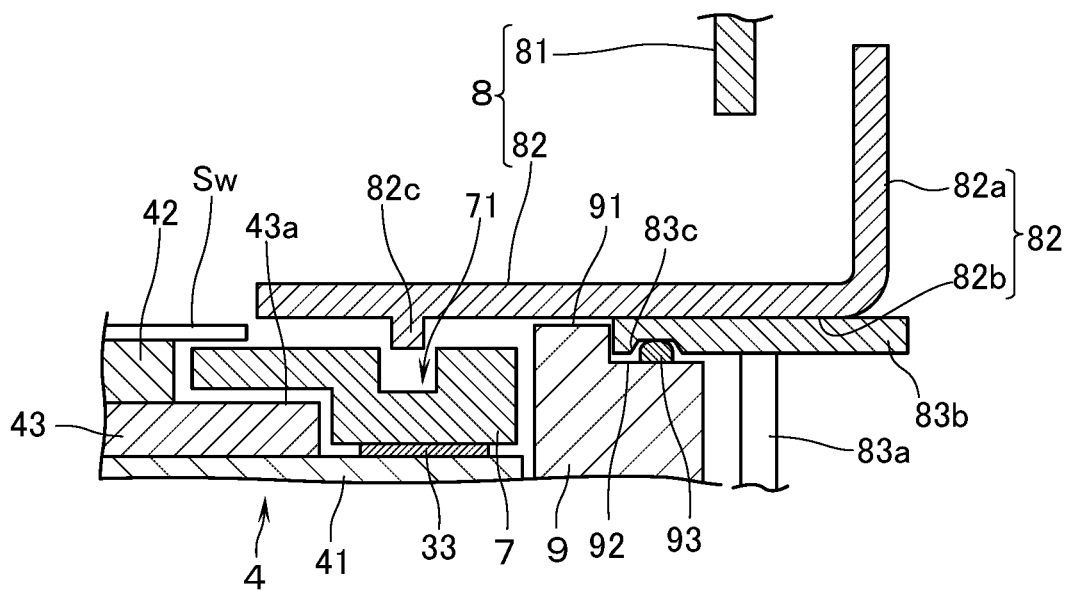
FIGS. 3a and 3b are partial sectional views, corresponding to FIG. 1, of a sputtering apparatus relating to a modified example.

In the modified example shown in FIG. 3a, the above-mentioned positioning mechanism is provided. In concrete, a single ring-shaped guide ring 83b is disposed on an upper end of each of the drive shafts 83a. Also, a recessed groove 83c is formed at a predetermined position on such a lower surface of the guide ring 83b as lies opposite to the top surface 91 of the block body 9 at a circumferential clearance (e.g., at a distance of 120 degrees). On the other hand, the top surface 91 of the block body 9 is formed into a stepped shape so as to allow for the movement of the lower deposition preventive plate 82 into the processing position (i.e., such that the guide ring 83b does not interfere). At a slightly lowered upper surface portion 93 of the top surface 91, a positioning pin 94 is disposed in a vertical posture in phase-alignment with the recessed grooves 83c. In this arrangement, at the processing position of the lower deposition preventive plate 82, by fitting each of the positioning pins 94 into each of the recessed grooves 83c, it is thus so arranged that a clearance of 1 mm or less can always be formed between the lower deposition preventive plate 82 and the block body 9 at the processing position.

Figure 3B:
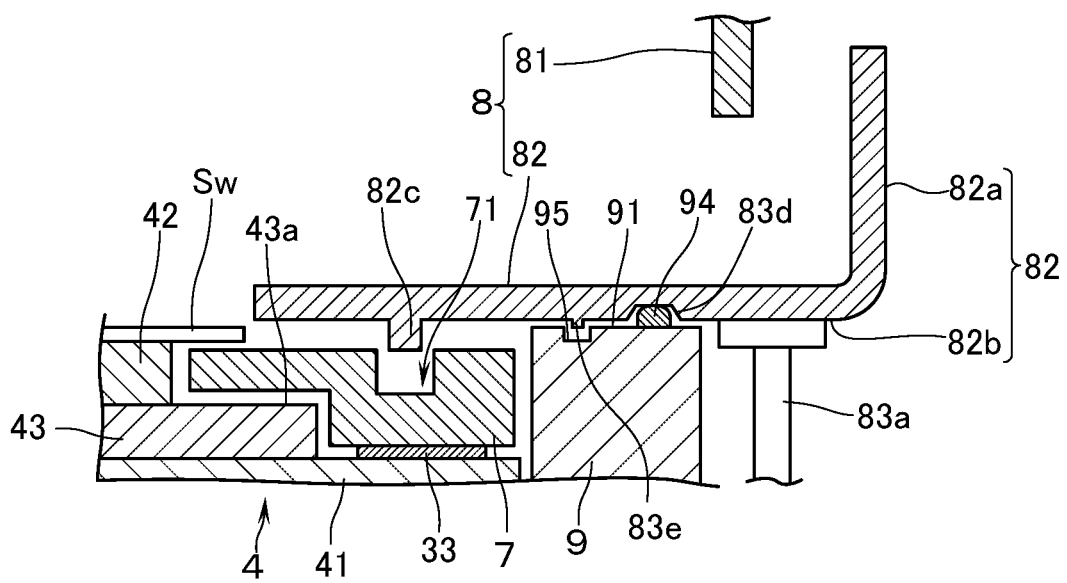

In the above-mentioned modified example, description was made of an example in which the recessed grooves 83c are formed at the predetermined positions on the lower surface of the guide ring 83b, and in which the positioning pins 94 are formed on the top surface 91 of the block body 9, but this invention shall not be limited to the above. In another modified example as shown in FIG. 3b, at a predetermined position of the upper surface 91 of the block body 9, positioning pins 95 are disposed in a vertical posture at a clearance in the circumferential direction (e.g., at a clearance of 120 degrees). At a predetermined lower surface of the flat part 82b of the lower deposition preventive plate 82, recessed holes 83d may be formed by aligning the phase with the positioning pins 95. In this case, it is considered that, if each of the positioning pins 95 is repeatedly fitted into each of the recessed holes 83d, particles will be generated, which in turn may give a bad effect on the substrate Sw. As a solution, in a position on the inside of the recessed holes 83d, projected strips 83e may be formed at a predetermined position of the lower surface of the flat part 82b and, at the same time, in phase alignment with the projected strips 83e, annular receiving recessed grooves 96 are formed for receiving therein the projected strips 83e on the top surface 91 of the block body 9 so that, at the processing position of the lower deposition preventive plate 82, the projected strips 83e and the annular receiving grooves 96 form a labyrinth structure.

Figure 4:
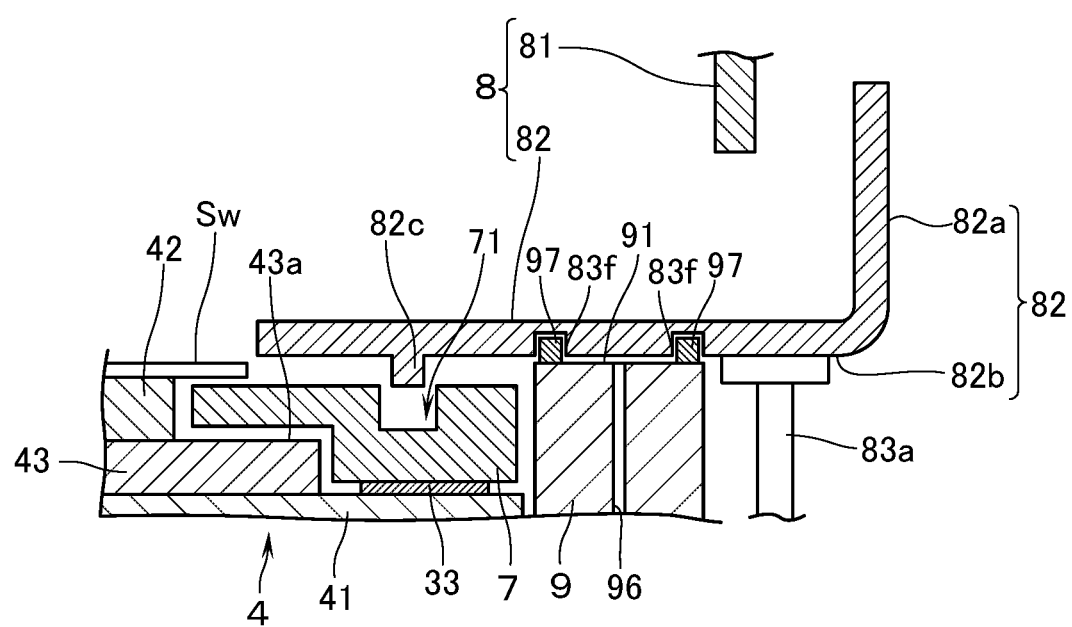
FIG. 4 is a partial sectional view, corresponding to FIG. 1, of a sputtering apparatus relating to a further modified example

Further, in the above-mentioned embodiment, a description was made of an example in which the cooling means, disposed on the wall surface of the vacuum chamber 1, is constituted by the jacket 11 in which the coolant is circulated, but this invention shall not be limited thereto. For example, a coolant circulation passage is formed inside the block body 9 so that the coolant can be circulated through the coolant circulation passage for direct cooling of the block body 9. On the other hand, it may be so arranged that a cryopanel for adsorbing the gas inside the vacuum chamber is disposed in a manner to lie opposite to the block body 9 inside the vacuum chamber 1 so that the block body 9 can be cooled. Further, as shown in FIG. 4, inside the block body 9 there may be formed a gas passage 97 which is in communication with the top surface 91 of the block body 9. At the processing position of the lower deposition preventive plate 82 a predetermined cooling gas such as argon, helium, and the like is introduced into the space between the lower deposition preventive plate 82 and the block body 9 so that the lower deposition preventive plate 82 can also be cooled by heat transfer from the cooling gas. In this case, projected strips 98 or receiving recessed grooves 83f are respectively formed on the top surface 91 and the lower surface of the flat part 82b of the lower deposition preventive plate 82 respectively. Labyrinth structure is thus formed by means of the projected strips 98 and the receiving recessed grooves 83f so as to minimize the conductance of the cooling gas. Otherwise, it is also possible to dispose a sealing member (not illustrated) so as to increase the pressure in the space between the lower deposition preventive plate 82 and the block body 9.

Further, in the above-mentioned embodiments, descriptions were made of examples in which the vacuum processing apparatus was made to be a sputtering apparatus SM, but as long as the vacuum chamber is provided with moveable deposition preventive plates, there is no particular limitation. For example, this invention can also be applied to a dry etching apparatus.

EXPLANATION OF MARKS

SM sputtering apparatus (vacuum processing apparatus)
1 vacuum chamber
11 jacket (cooling means)
4 stage
41 base
43 hot plate
8 deposition preventive plate
82 lower deposition preventive plate
9 block body
92 heat transfer sheet
Sw substrate (to-be-processed substrate)

The invention claimed is:

1. A vacuum processing apparatus which comprises a vacuum chamber and which performs a predetermined vacuum processing on a to-be-processed substrate set in position in the vacuum chamber, the vacuum chamber having therein a deposition preventive plate which is made up of a fixed deposition preventive plate and a moveable deposition preventive plate, the vacuum processing apparatus further comprising:
   a block body which is made of metal, and which is located outside a circumference of the to-be-processed substrate, and disposed in a vertical posture on an inner wall surface of the vacuum chamber configured to cool the deposition preventive plate; and
   a cooling means configured to cool the block body,
   wherein the moveable deposition preventive plate is configured to move relative to the to-be-processed substrate between a processing position of the moveable deposition preventive plate at which processing position a predetermined vacuum processing is performed on the to-be-processed substrate, and a transporting position of the moveable deposition preventive plate at which the to-be-processed substrate can be transported, and
   wherein, at a processing position, a clearance in a vertical direction between a top surface of the block body and the moveable deposition preventive plate is set to 1 mm or below or in contact with each other and, at the transporting position, the top surface of the block body is out of contact with the moveable deposition preventive plate.

2. The vacuum processing apparatus according to claim 1, wherein the cooling means is made up of a jacket disposed on a wall surface of the vacuum chamber such that the block body is cooled by heat transfer from the wall surface of the vacuum chamber when a coolant is circulated through the jacket.

3. The vacuum processing apparatus according to claim 2, further comprising a heat transfer sheet interposed between the inner wall surface of the vacuum chamber and the block body.

* * * * *